(12) United States Patent
Fricker

(10) Patent No.: US 11,367,701 B2
(45) Date of Patent: *Jun. 21, 2022

(54) APPARATUS AND METHOD FOR SECURING SUBSTRATES WITH VARYING COEFFICIENTS OF THERMAL EXPANSION

(71) Applicant: Cerebras Systems Inc., Los Altos, CA (US)

(72) Inventor: Jean-Philippe Fricker, Los Altos, CA (US)

(73) Assignee: Cerebras Systems Inc., Los Altos, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/114,287

(22) Filed: Dec. 7, 2020

(65) Prior Publication Data

US 2021/0091035 A1  Mar. 25, 2021

Related U.S. Application Data

(63) Continuation of application No. 16/860,985, filed on Apr. 28, 2020, now Pat. No. 10,892,244, which is a continuation of application No. 16/583,725, filed on Sep. 26, 2019, now Pat. No. 10,672,732, which is a
(Continued)

(51) Int. Cl.
*H01L 23/00* (2006.01)
*H01L 23/538* (2006.01)
*H01L 25/065* (2006.01)

(52) U.S. Cl.
CPC .......... *H01L 24/32* (2013.01); *H01L 23/5386* (2013.01); *H01L 23/562* (2013.01); *H01L 24/29* (2013.01); *H01L 24/72* (2013.01); *H01L 24/83* (2013.01); *H01L 25/0655* (2013.01); *H01L 2224/29186* (2013.01); *H01L 2224/32225* (2013.01); *H01L 2224/831* (2013.01);
(Continued)

(58) Field of Classification Search
None
See application file for complete search history.

(56) References Cited

U.S. PATENT DOCUMENTS

| | | | |
|---|---|---|---|
| 4,932,883 A | 6/1990 | Hsia et al. |
| 4,949,035 A | 8/1990 | Palmer |
| 4,998,885 A | 3/1991 | Beaman |

(Continued)

FOREIGN PATENT DOCUMENTS

JP    S60100441 A    6/1985

OTHER PUBLICATIONS

European Search Report for application No. 18837853.2 dated Mar. 25, 2021.
(Continued)

*Primary Examiner* — Alexander G Ghyka
(74) *Attorney, Agent, or Firm* — Jeffrey Schox

(57) ABSTRACT

An integrated circuit assembly that includes a semiconductor wafer having a first coefficient of thermal expansion; an electronic circuit substrate having a second coefficient of thermal expansion that is different than the first coefficient of thermal expansion; and an elastomeric connector arranged between the semiconductor wafer and the electronic circuit substrate and that forms an operable signal communication path between the semiconductor wafer and the electronic circuit substrate.

20 Claims, 13 Drawing Sheets

Related U.S. Application Data continuation of application No. 16/029,207, filed on Jul. 6, 2018, now Pat. No. 10,468,369.

(60) Provisional application No. 62/536,071, filed on Jul. 24, 2017.

(52) U.S. Cl.
CPC ............... *H01L 2924/15192* (2013.01); *H01L 2924/351* (2013.01)

(56) References Cited

U.S. PATENT DOCUMENTS

| | | | |
|---|---|---|---|
| 5,140,405 A | 8/1992 | King et al. | |
| 5,308,682 A | 5/1994 | Morikawa | |
| 5,898,227 A | 4/1999 | Geffken et al. | |
| 6,190,509 B1 | 2/2001 | Haba | |
| 6,281,577 B1 | 8/2001 | Oppermann et al. | |
| 6,316,334 B1 | 11/2001 | Sivilotti et al. | |
| 6,477,058 B1 | 11/2002 | Luebs et al. | |
| 6,936,521 B2 | 8/2005 | Chien | |
| 7,564,554 B2 | 7/2009 | Weiss | |
| 7,681,309 B2 | 3/2010 | Miller | |
| 8,316,329 B1 | 11/2012 | Rigby et al. | |
| 10,468,369 B2 | 11/2019 | Fricker | |
| 10,672,732 B2* | 6/2020 | Fricker | H01L 24/85 |
| 10,892,244 B2* | 1/2021 | Fricker | H01L 24/29 |
| 2002/0185661 A1 | 12/2002 | Kawanobe et al. | |
| 2003/0006493 A1 | 1/2003 | Shimoishizaka et al. | |
| 2003/0146510 A1 | 8/2003 | Chien | |
| 2005/0110160 A1 | 5/2005 | Faroog et al. | |
| 2006/0043567 A1 | 3/2006 | Palanduz | |
| 2006/0141667 A1 | 6/2006 | Milbrand et al. | |
| 2008/0157396 A1 | 7/2008 | Yang | |
| 2008/0315389 A1 | 12/2008 | Nunn | |
| 2009/0108441 A1 | 4/2009 | Barr et al. | |
| 2011/0147911 A1 | 6/2011 | Kohl et al. | |
| 2013/0015587 A1 | 1/2013 | Okutsu et al. | |
| 2013/0155796 A1 | 6/2013 | Sugawara | |
| 2014/0035093 A1 | 2/2014 | Pincu et al. | |
| 2014/0035106 A1 | 2/2014 | Vu et al. | |
| 2014/0070423 A1 | 3/2014 | Woychik et al. | |
| 2014/0084427 A1 | 3/2014 | Gaskins | |
| 2015/0076714 A1 | 3/2015 | Haba et al. | |
| 2016/0218057 A1 | 7/2016 | Lee et al. | |
| 2017/0069595 A1 | 3/2017 | Haba | |
| 2017/0084539 A1 | 3/2017 | Gao et al. | |
| 2017/0374738 A1 | 12/2017 | Lee et al. | |
| 2018/0068938 A1 | 3/2018 | Yazdani | |

OTHER PUBLICATIONS

International Search Report and Written Opinion for PCT Application No. PCT/US2018039700 dated Sep. 13, 2018.
International Search Report and Written Opinion for PCT Application No. PCT/US18/45519, dated Oct. 26, 2018, Oct. 26, 2018.
International Search Report and Written Opinion for PCT Application No. PCT/US18/041090, dated Sep. 19, 2018, Sep. 19, 2018.
West, Perry, "Anatomy of an Application: Automatic Alignment in the Semiconductor Industry", Imagination Corporation and Automated Vision Systems, Inc. 2000, http://www.imagenation.com/pdf/align.pdf.
Lee, Sang Hwui, et al., "Wafer-to-Wafer Alignment for Three-Dimensional Integration: A Review", Journal of Microelectromechanical Systems, vol. 20, No. 4, Aug. 2011.
European Search Report for application No. 18839270.8 dated Apr. 15, 2021.

* cited by examiner

200

Providing a Semiconductor Substrate S210

Identifying a Largest Square S215

Fabricating Circuitry Layers S220

Providing Self-Correcting Mechanisms S222

Providing a Protective Barrier S225

Fabricating Inter-Die Connections S230

Semiconductor Substrate Reduction S240

Providing a Semiconductor Substrate S710

Providing a Semiconductor Board S720

Providing an Elastomeric Connector S730

Positioning the Elastomeric Connector S740

Providing Compressive Load S750

FIGURE 7

APPARATUS AND METHOD FOR SECURING SUBSTRATES WITH VARYING COEFFICIENTS OF THERMAL EXPANSION

CROSS-REFERENCE TO RELATED APPLICATIONS

This application is a continuation of U.S. patent application Ser. No. 16/860,985, filed 28 Apr. 2020, which is a continuation of U.S. patent application Ser. No. 16/583,725, filed 26 Sep. 2019, which is a continuation of U.S. patent application Ser. No. 16/029,207, filed 6 Jul. 2018, which claims the benefit of U.S. Provisional Application No. 62/536,071, filed 24 Jul. 2017, and U.S. Provisional Application No. 62/536,063, filed 24 Jul. 2017, which are both incorporated in their entireties by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

SUMMARY OF THE INVENTION

In one embodiment, an integrated circuit assembly comprises: a semiconductor wafer having a first coefficient of thermal expansion; an electronic circuit substrate having a second coefficient of thermal expansion that is different than the first coefficient of thermal expansion; and an elastomeric connector arranged between the semiconductor wafer and the electronic circuit substrate and that forms an operable signal communication path between the semiconductor wafer and the electronic circuit substrate.

In one embodiment, the elastomeric connector comprises a membrane having a plurality of conductive elements distributively arranged within a body of the membrane, and when the plurality of conductive elements come into physical contact, the plurality of conductive elements form a plurality of disparate signal communication paths within the body of the membrane.

In one embodiment, the membrane comprises a silicon membrane, and the plurality of conductive elements comprise a plurality of metal ball wires.

In one embodiment, the semiconductor wafer comprises: a plurality of die formed with a substrate of the semiconductor wafer; a circuit layer formed at each of the plurality of die; and a plurality of inter-die connections that communicatively connect disparate die formed with the substrate.

In one embodiment, each of the plurality of disparate signal communication paths define a vertical signal conductive path extending from the semiconductor wafer to the electronic circuit substrate.

In one embodiment, when a compressive load is applied to the elastomeric connector, the plurality of conductive elements come into physical contact to form a chain of conductive elements that elastically deform into an arc-shaped configuration that elastically resists compressive forces and shearing forces along the body of the membrane.

In one embodiment, the semiconductor wafer comprises a plurality of signal conducting pads at a surface of the semiconductor wafer that interfaces with the elastomeric connector; the electronic circuit substrate comprises a plurality of signal conducting pads at a surface of the electronic circuit substrate that interfaces with the elastomeric connector; and when the elastomeric connector is placed under compression, the plurality of conductive elements come into physical contact with each other and conductively connect the plurality of signal conducting pads of the semiconductor wafer and the plurality of signal conducting pads of the electronic circuit substrate.

In one embodiment, surfaces of adjacent conductive elements of the plurality of conductive elements are slidably connected and resist one or more shearing forces applied to the elastomeric connector by sliding in directions in which the one or more shearing forces are applied.

In one embodiment, the electronic circuit substrate comprises one of a printed circuit board and an organic substrate.

In one embodiment, the elastomeric connector elastically deforms at a first rate of deformation at a first interfacing region between the semiconductor wafer and a first surface of the elastomeric connector, and the elastomeric connector elastically deforms at a second rate of deformation at a second interfacing region between the electronic circuit substrate and a second surface of the elastomeric connector.

In one embodiment, the first rate of deformation of the elastomeric connector is based on the first coefficient of thermal expansion of the semiconductor wafer, and the second rate of deformation of the elastomeric connector is based on the second coefficient of thermal expansion of the electronic circuit substrate.

In one embodiment, a method of assembling an integrating circuit includes arranging a semiconductor wafer within an integrated circuit assembly; arranging an electronic circuit substrate within the integrated circuit assembly; arranging an elastomeric connector between the semiconductor wafer and the electronic circuit substrate; and using the elastomeric connector to form an operable signal communication path between the semiconductor wafer and the electronic circuit substrate.

In one embodiment, the elastomeric connector comprises a membrane having a plurality of conductive elements distributively arranged within a body of the membrane, and when the plurality of conductive elements come into physical contact, the plurality of conductive elements form a plurality of disparate signal communication paths within the body of the membrane.

In one embodiment, the semiconductor wafer comprises: a plurality of die formed with a substrate of the semiconductor wafer; a circuit layer formed at each of the plurality of die; and a plurality of inter-die connections that communicatively connect disparate die formed with the substrate.

In one embodiment, a method of assembling the integrated circuit includes forcing the plurality of conductive elements into physical contact by applying a compressive force to the integrated circuit assembly that includes the semiconductor wafer, the elastomeric connector, and the electronic circuit substrate.

In one embodiment, a method of assembling the integrated circuit includes using the plurality of conductive elements to elastically resist a shearing force across the membrane of the elastomeric connector in response to one or more environmental changes affecting an expansion of one or more of the semiconductor wafer and the electronic circuit substrate.

In one embodiment, a method of assembling the integrated circuit includes arranging electrically conductive pads of the semiconductor substrate on a first surface of the elastomeric connector; positioning electrically conductor pads of the electronic circuit substrate on a second surface of the elastomeric connector, wherein the plurality of conductive elements within the membrane of the elastomeric connector transmit electrical signals between the semiconductor substrate and the electronic circuit substrate.

In one embodiment, surfaces of adjacent conductive elements of the plurality of conductive elements are slidably connected and resist shearing forces applied to the elastomeric connector by sliding in a direction in which the shearing forces are applied.

In one embodiment, a semiconductor assembly includes: a semiconductor wafer having a first coefficient of thermal expansion; a circuit board having a second coefficient of thermal expansion that is distinct from the first coefficient of thermal expansion; an elastomeric connector that is interposed between the semiconductor wafer and the circuit board, wherein the elastomeric connector comprises a plurality of conductive elements that when under compression come into contact and form a plurality of signal conducting paths between the semiconductor wafer and the circuit board.

In one embodiment, the semiconductor wafer comprises: a plurality of die formed with a substrate of the semiconductor wafer; a circuit layer formed at each of the plurality of die; and a plurality of inter-die connections that communicatively connect disparate die formed with the substrate.

BRIEF DESCRIPTION OF THE FIGURES

FIG. 2 illustrates a method 200 in accordance with one or more embodiments of the present application;

FIG. 7 illustrates a method 700 in accordance with one or more embodiments of the present application.

DESCRIPTION OF THE PREFERRED EMBODIMENTS

Figure 1:
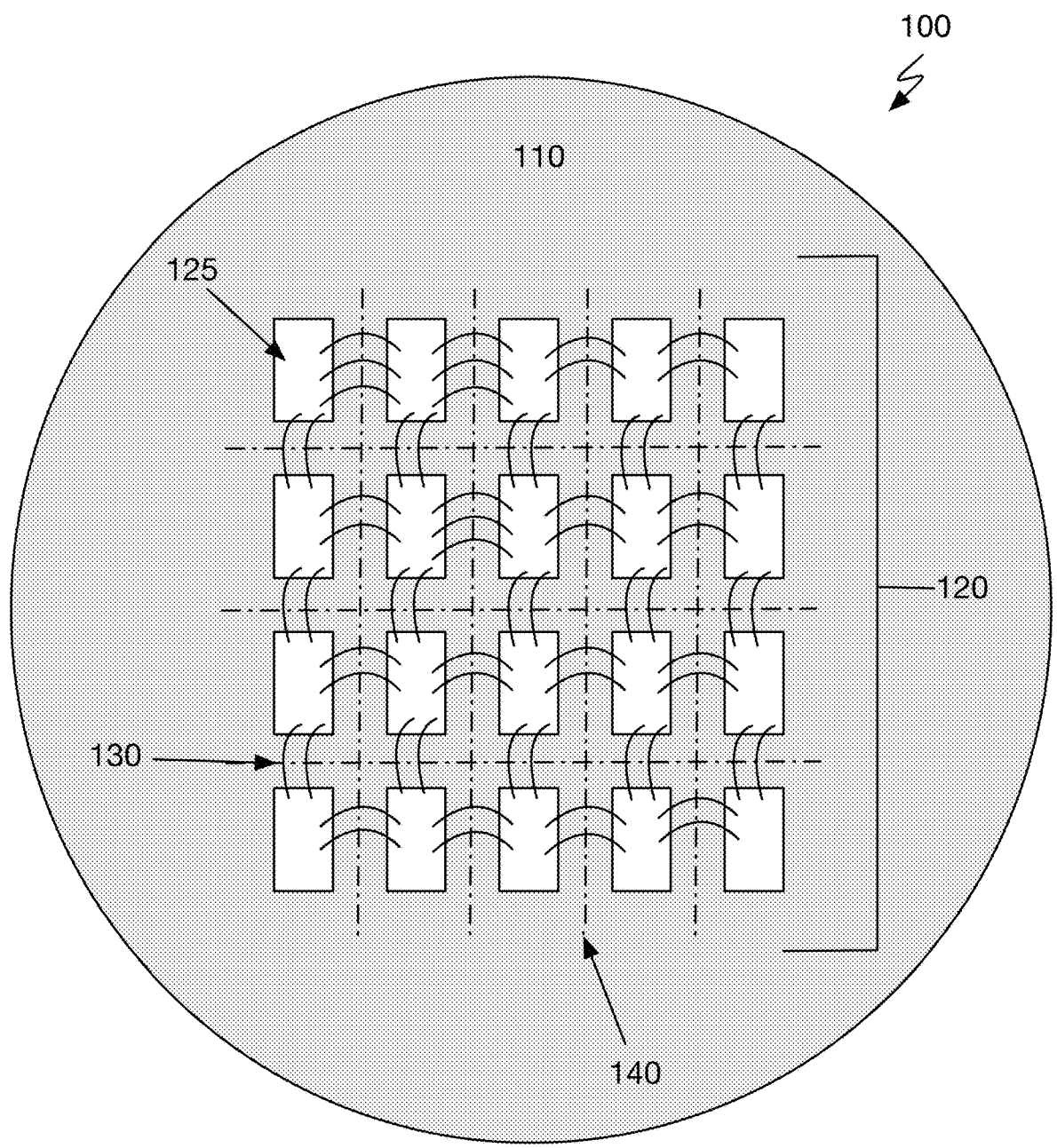
FIG. 1 illustrates a schematic of a system 100 in accordance with one or more embodiments of the present application.
Figure 3A:
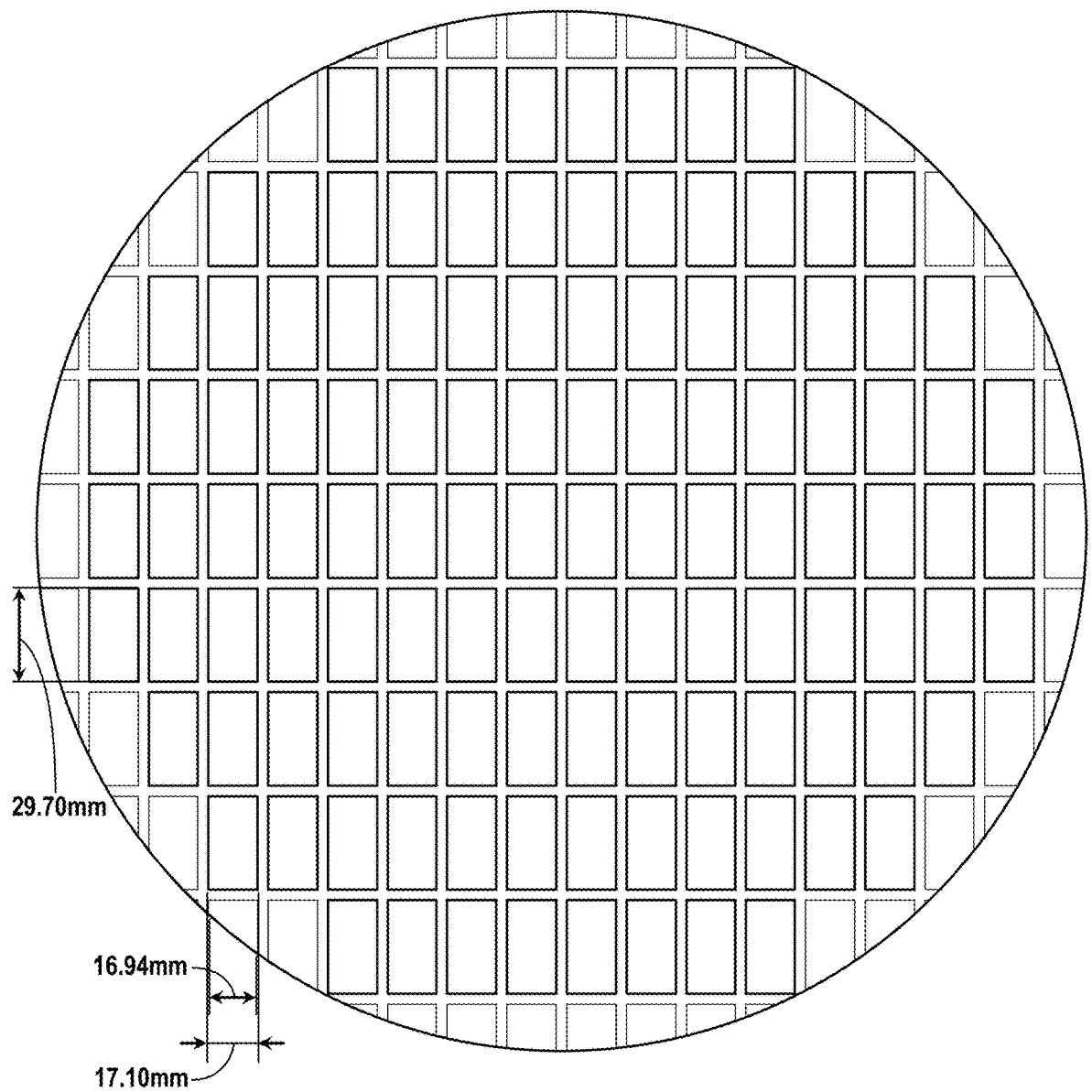
FIG. 3A-3D illustrate several schematics of a semiconductor substrate without and with interconnections in accordance with one or more embodiments of the present application.
Figure 3B:
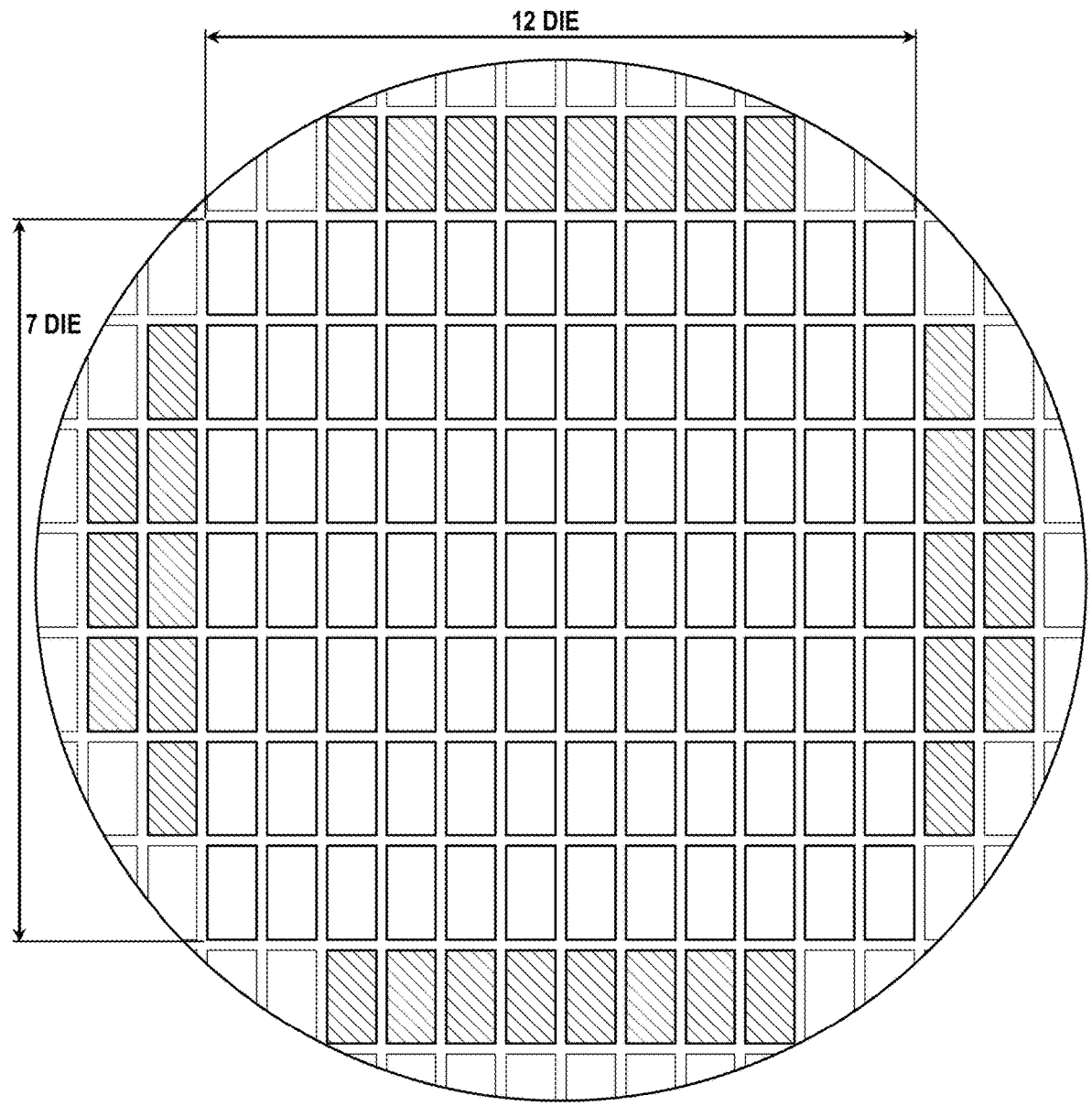
Figure 3C:
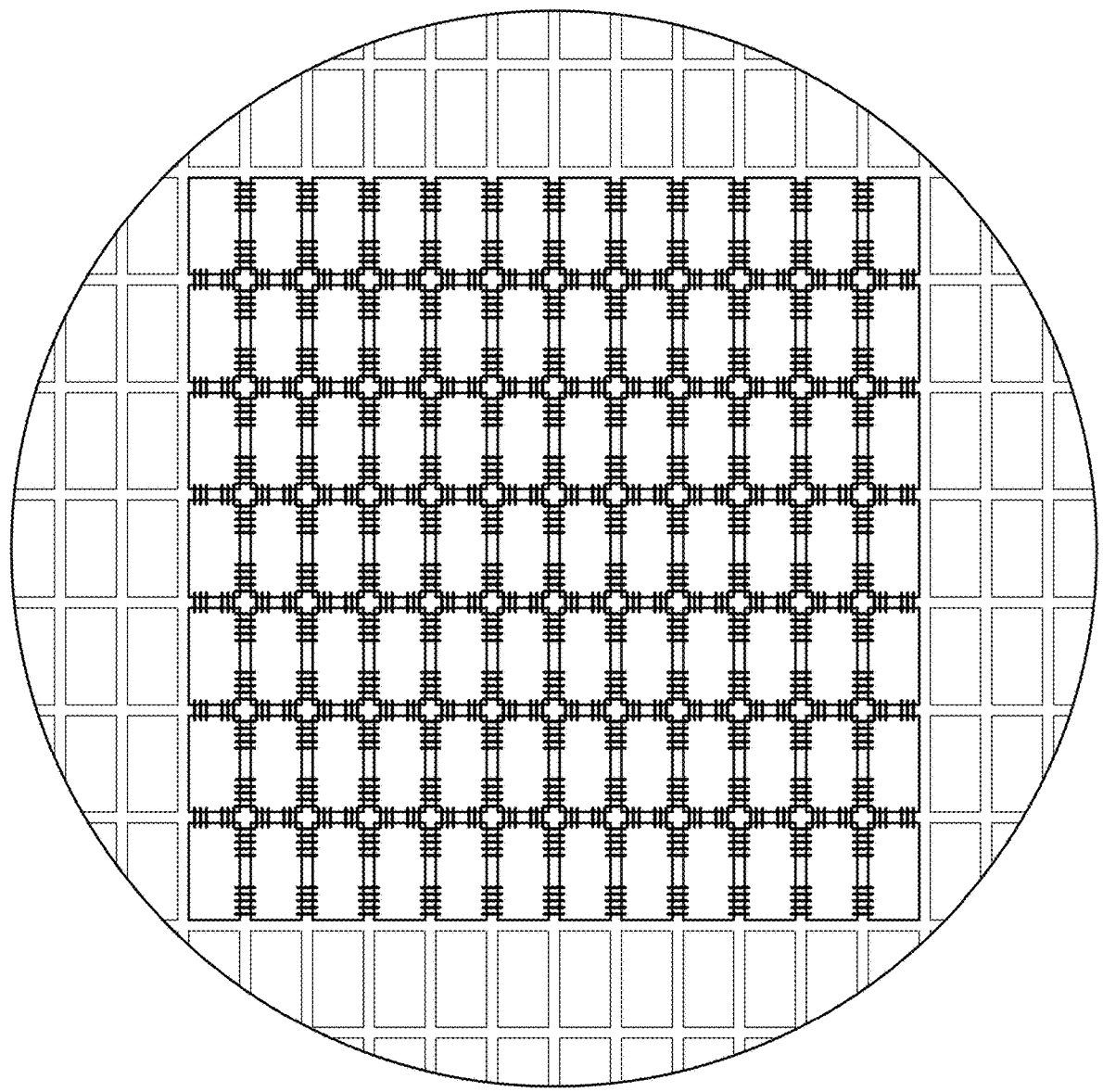
Figure 3D:
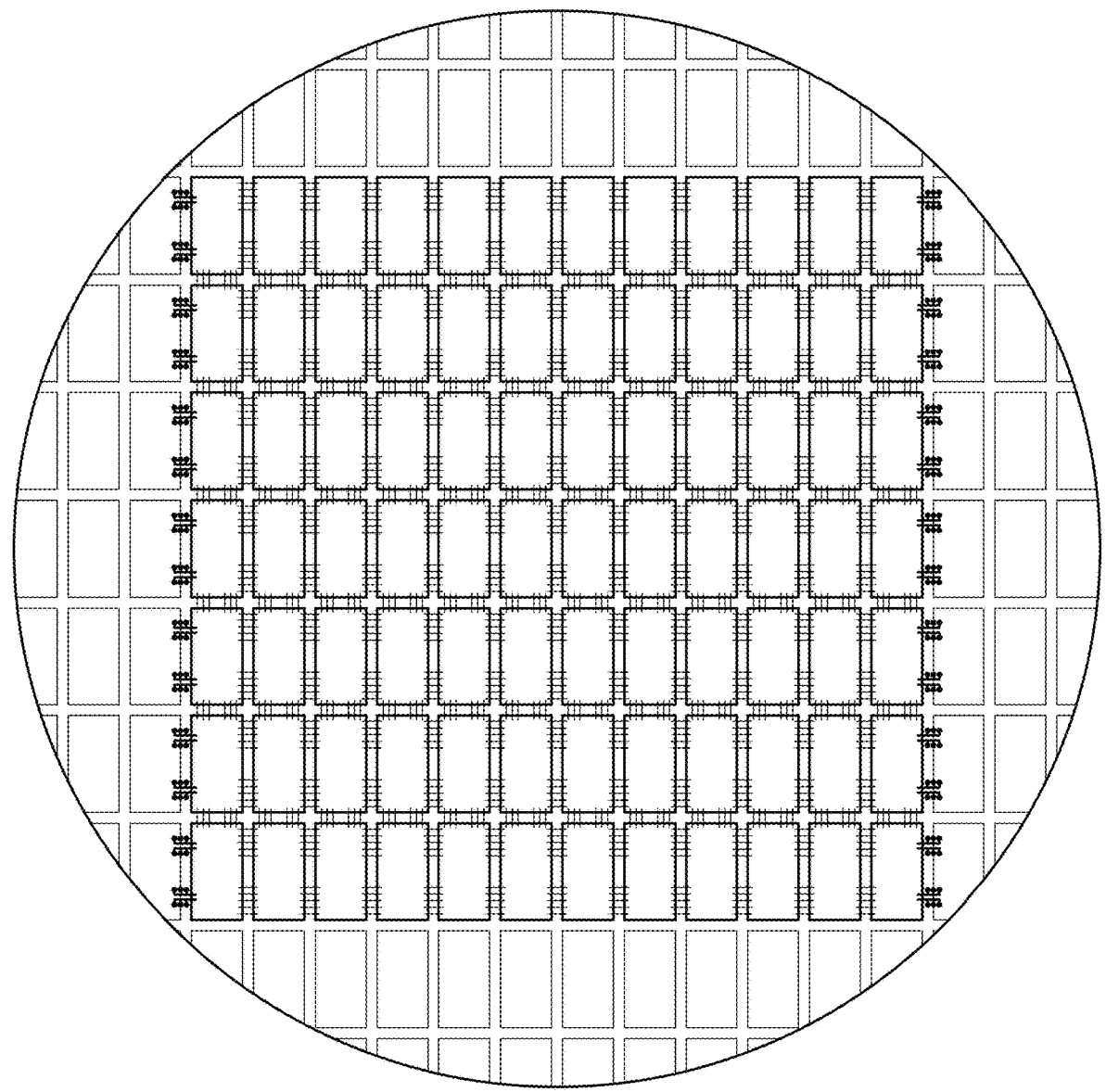
Figure 4A:
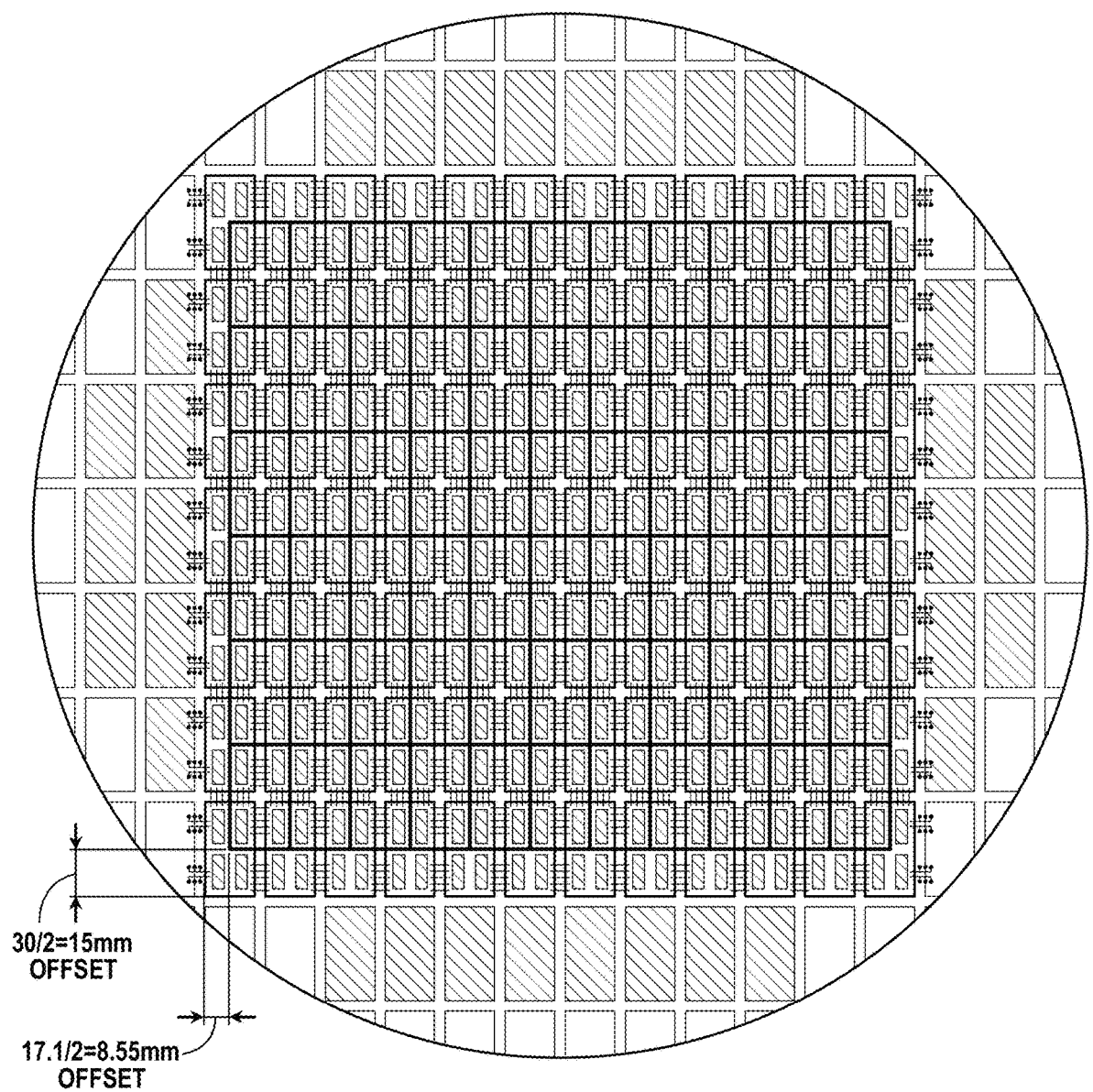
FIG. 4A-4D illustrate several schematics of a semiconductor substrate during exposure processes and size reduction in accordance with one or more embodiments of the present application.
Figure 4B:
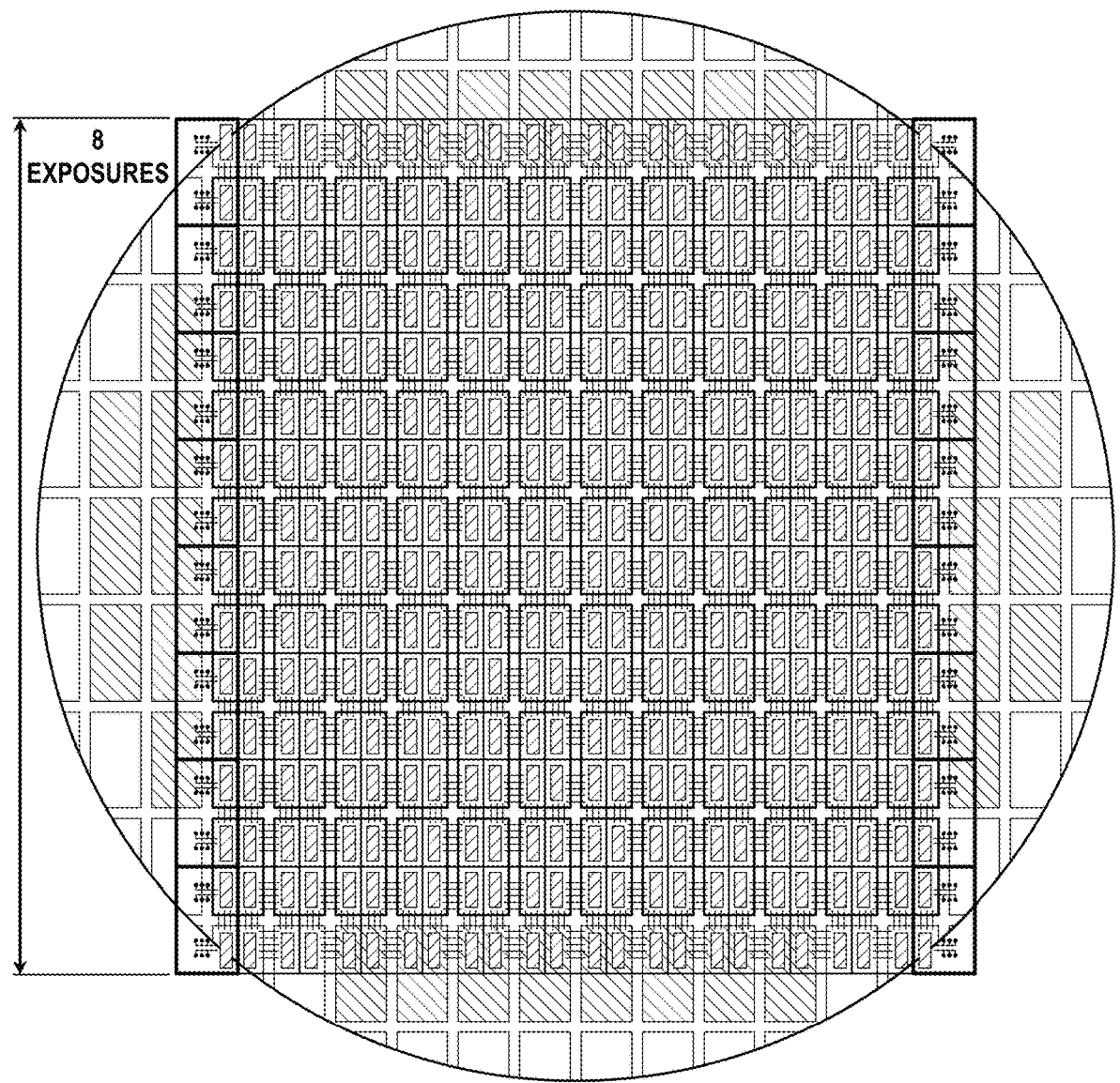
Figure 4C:
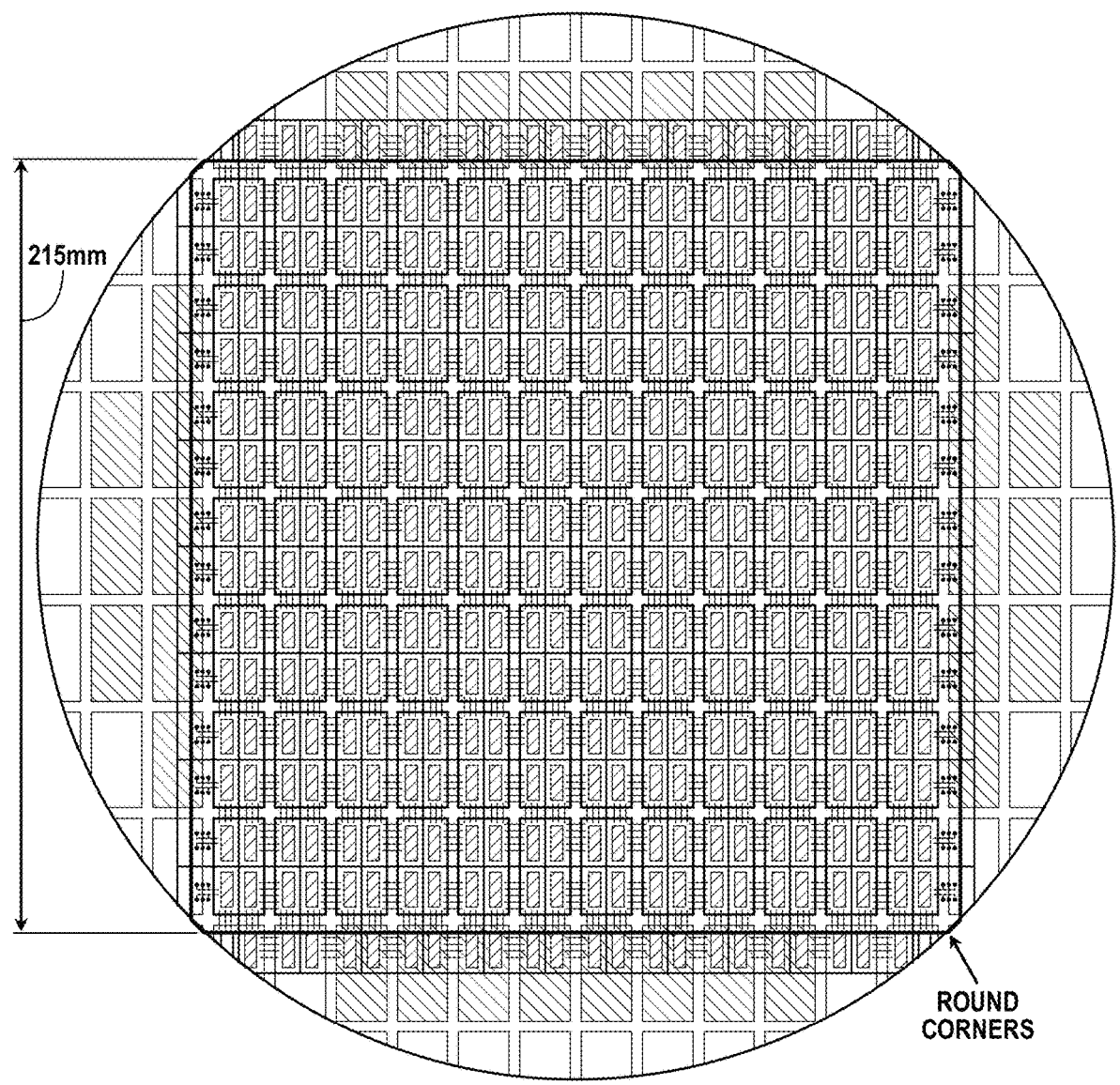
Figure 4D:
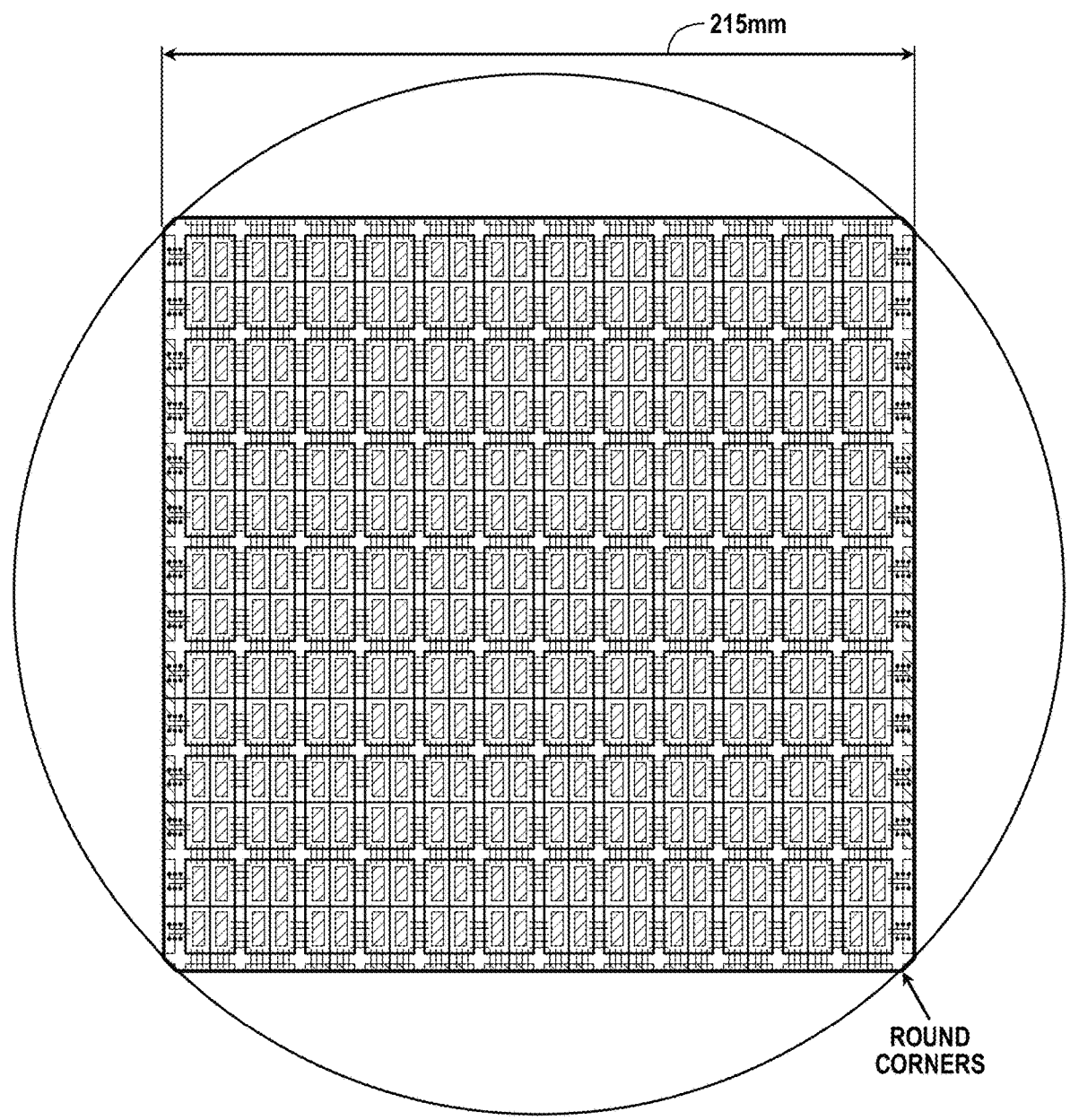

The following description of preferred embodiments of the present application are not intended to limit the inventions to these preferred embodiments, but rather to enable any person skilled in the art of to make and use these inventions.

1. Overview 1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. In general, a printed circuit board typically functions to mechanically support and electrically connect electronic components or electrical components using conductive tracks, pads, and other features etched from one or more sheet layers of metal (e.g., copper) laminated onto and/or between sheet layers of a non-conductive substrate. The (electrical or signal) communication connections between the chips may typically be found in the PCB. However, when a multi-chip PCB is manufactured in this manner, the communication between disparate chips thereon becomes limited by the amount connectivity or bandwidth available in a given connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, a number of technical problems relating to operational yield of the die on the large chip, packaging of the large chip, and powering/cooling of the large chip must also be solved.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved, the very large size of the resulting die then gives rise to many technical issues at the system level when packaging the very large die to a PCB or an organic substrate (or any suitable substrate).

The embodiments of the present application, therefore, also provide a system and method for enabling a large silicon die, similar to those described in section 1.1 and beyond, to package with non-compliant coefficient of thermal expansion (CTE) PCBs or organic substrates.

The technical problem of CTE mismatch arises in the computer chip packaging process is due to differences in the CTE of silicon onto which an integrated circuit is fabricated and the CTE of the PCB onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip. In traditional chip packaging, it is only a single silicon die with circuitry that is attached to a PCB at a time and the relatively small size of the single silicon die may produce a small expansion mismatch with the PCB that the single silicon die is attached to.

For instance, to attach a single silicon die to a PCB, small microbumps are added to a surface of the single silicon die then the silicon die is affixed to the PCB. When the single silicon die and the PCB expand at different rates due to differences in CTE properties of the material, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no PCBs that may be selected to achieve CTE compatibility with the CTE of the large silicon die.

To address at least these technical problems, embodiments of the present application provide an elastomeric connector that is disposed between the large silicon die and a PCB or other organic substrate. The elastomeric connector may be capable of conducting a signal through it while under placed under pressure and may also be malleable. The malleability of the elastomeric connector allows for absorption of the shearing displacement between the large silicon die and the PCB.

2. An IC with Inter-Die Connections and an Elastomeric Connector Assembly 2.1 IC with Inter-Die Connections As shown in FIG. 1, a semiconductor 100 illustrates an example integrated circuit having a substrate 110, a plurality of die 120 formed with the substrate no, a circuit layer 125, a plurality of inter-die connections 130, and scribe lines 140.

The semiconductor 100 may be manufactured using any suitable lithography system that is configured to implement the one or more steps of the methods described herein, including method 200.

The semiconductor 100 functions to enable inter-die communications between the plurality of die 120 formed with the single substrate no. The inter-die connections 130 formed between adjacent die on the substrate no improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasedly faster communications and data processing between die when compared, at least, to communications between die not maintained on a same substrate (e.g., a same wafer). Each of the plurality of die 120 remain on the single substrate no and are not cut from the substrate no into individual dice for separate packaging into an individual computer chip. Rather, at formation, only excess die (e.g., die that are not provided with circuitry or inactive die) along a periphery of the substrate no are preferably removed from the substrate no and the remaining portions of the substrate no having the plurality of die 120 (e.g., active die) may form a predetermined shape (e.g., a rectangular shape) with the substrate no. The resultant substrate no after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate no and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate no. That is, each inter-die connection 130 may be formed or provided to extend from a first dice to a second dice located on the substrate no. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate no.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate no. When positioned in an interior of the substrate no, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate no.

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Elastomeric Connector Assembly

Figure 5:
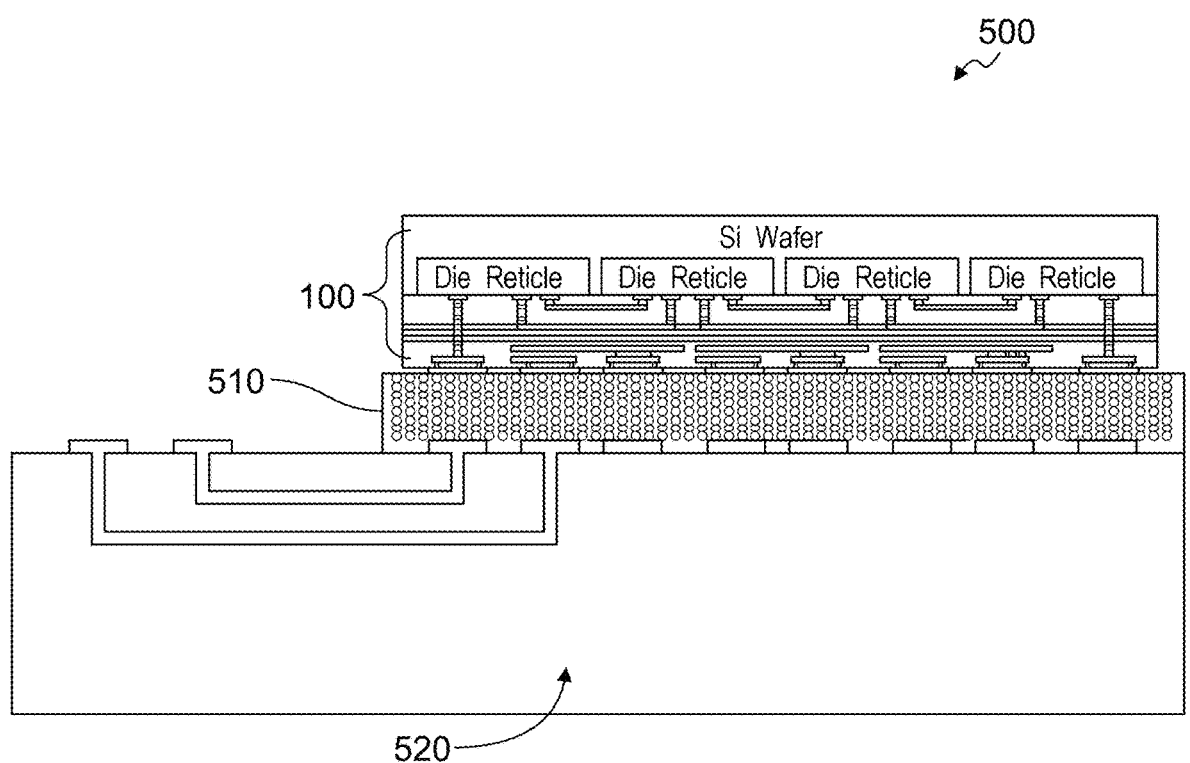
FIG. 5 illustrates a semiconductor assembly 500 in accordance with one or more embodiments of the present application.

As shown in FIG. 5, a semiconductor assembly 500 illustrates an elastomeric connector 510 disposed between the semiconductor 100 and a circuit board 520.

The elastomeric connector 510 functions to secure the large semiconductor 100 to a circuit board 520. The elastomeric connector 510 preferably functions to place the semiconductor 100 and circuit board 520 in operable signal communication by conducting signals between them in a vertical direction (a direction normal to surfaces of both the semiconductor 100 and circuit board 520). Specifically, each of the semiconductor 100 and the circuit board 520 may include one or more conductive pads. The conductive pads of the semiconductor 100 may generally oppose the conductive pads of the circuit board 520 and may also, have a one-to-one alignment with each other. The elastomeric connector 510 is preferably designed to be interposed between the opposing surfaces of the conductive pads of both the semiconductor 100 and the circuit board 520. In this way, signals provided by a conductive pad of either the semiconductor 100 or the circuit board 520 may be transmitted through the elastomeric conductor 510 to an opposite conductive pad of the other of the semiconductor 100 and the circuit board 520.

Figure 6A:
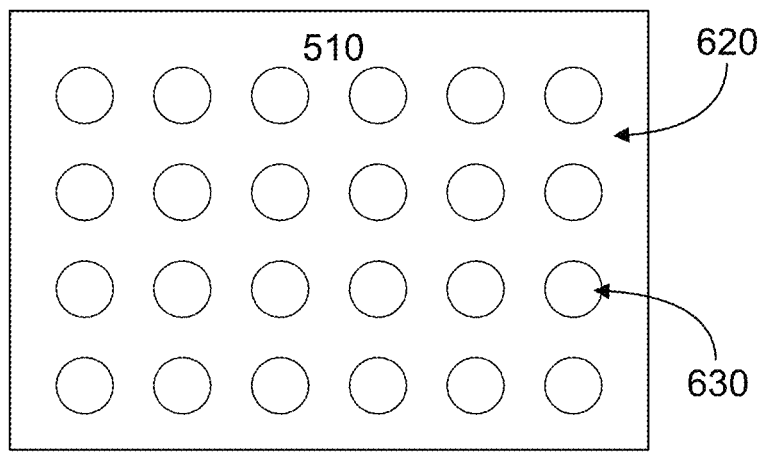
FIG. 6A-6B illustrate schematic examples of an elastomeric connector in accordance with one or more embodiments of the present application.

As shown in FIG. 6A, the elastomeric connector 510 includes a membrane 620 having a plurality of conductive elements 630. The membrane 620 may be any suitable material but is preferably made using silicon material.

Figure 6B:
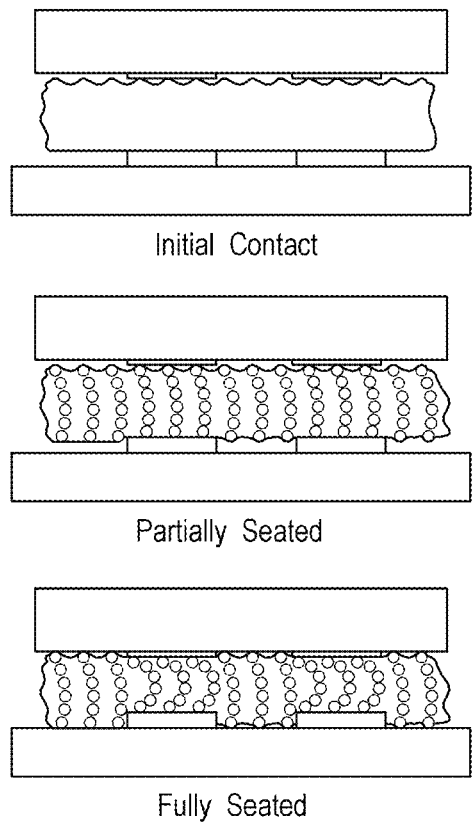

The plurality of conductive elements 630 may be any suitable conductive material that are arranged distributively and/or separately arranged within a body of the membrane 620. The plurality of conductive elements generally include a plurality of particles, such as ball wires, that when placed under compression (e.g., vertical compression) come into conductive contact with adjacent particles. That is, in a first state (of un-compression) in which the elastomeric connector 510 is not placed under a compressive load, the plurality of conductive elements 630 are preferably distributed within the body of the membrane 620 substantially (some contact) or fully independent (no contact) of each other. However, in a second state (of compression) in which the elastomeric connector 510 is placed under a compressive load, the plurality of conductive elements 630 preferably come into contact and may function to form multiple disparate conductive chains (conductive strings) or electrical paths from a first surface region of the elastomeric connector 510 to a second surface region (preferably opposing surface region) of the elastomeric connector 510 that function to electrically connect the conductive pads of the semiconductor 100 and the conductive pads at the circuit board 520. As shown in FIG. 6B, when under compression, the plurality of conductive elements 630 only make contact vertically and not horizontally. However, it shall be noted that if a laterally compressive force were applied to the elastomeric connector 510, the plurality of conductive elements 630 would similarly come into contact to form an electrical signal path between the opposing surface regions of the elastomeric connector 510.

The plurality of conductive elements 630 may, additionally, function to provide an elastic effect or spring effect in one or more portions of the elastomeric connector 510 to generally resist compressive forces, shearing forces, and/or permanent deformations in the elastomeric connector 510. Accordingly, when one or more portions of the elastomeric connector 510 is placed under a load, the plurality of conductive elements 630 may elastically compress without allowing the elastomeric connector 510 to undergo permanent deformation. That is, even after a large load (e.g., four tons of pressure or the like) the plurality of conductive elements 630 are sufficiently elastic to allow the elastomeric connector 510 to regain its original form or substantially its original form when the elastomeric connector 510 is not placed under the large load.

In the case that the plurality of conductive elements 630 comprise metal ball wires, the elastic effect is achieved when a load is placed onto the elastomeric connector 510 thereby causing the ball wires to come into conductive and elastic contact with each other. The ball wires when in contact form a substantially vertical conductive path (or in some embodiments, a lateral conductive path), as shown by way of example in FIG. 6B. Additionally, or alternatively, a vertical spring or elastic chain in which the adjacent ball wires forming the vertical conductive path and spring may be permitted to slide against each other in a horizontal direction (e.g., in a direction normal to a direction of a load) and in the vertical direction (albeit slightly) while maintaining continuous contact. In some embodiments, adjacent surfaces of the ball wires, when in contact, are permitted to slide against each other in the conductive and elastic path allows the conductive and elastic path to shift (while maintaining conductive and elastic contact) and form an arc. The arc formed by the ball wires while under a compressive load may have varying radii along the arc. Additionally, the arcs formed by horizontally adjacent vertical conductive and elastic paths may have similar or different arcs depending on an amount of load applied thereon.

The arc-shaped configuration of the ball wires when placed under a compressive load preferably allows for significant deformation (e.g., beyond some deformation threshold) of the elastomeric connector 510 while allowing the ball wires to maintain signal communication between the semiconductor 110 and the circuit board 520 and also, allow the ball wires to elastically resist variable shearing forces along the elastomeric connector 510 by allowing radii along the signal conductive path or conductive chain formed thereby to shift or change according to varying shearing forces applied to the various sections of the signal conductive path. That is, because the semiconductor 100 may expand or contract at a different rate than the circuit board 520, shearing forces experienced along top portion or region of the elastomeric connector 510 may be different than the shearing forces experienced along a bottom portion or region of the elastomeric connector 510. Accordingly, the resulting shearing forces experienced along the signal conductive path formed by the plurality of ball wires (e.g., the plurality of conductive elements) may also vary from a top region to a bottom region of the elastomeric connector 510.

Further yet, the plurality of conductive elements 630 while under compression and while maintaining conductive contact function to enable a shearing force absorption effect while maintaining signal conductivity between the semiconductor 100 and the circuit board 520. A shearing effect or shearing force against the elastomeric connector 510 may generally be caused by a disparity between the CTE of the circuit board 520 and the semiconductor 100. The semiconductor 100 being preferably made of silicon material typically may not vary greatly, in terms of expansion (expands approximately at 3 parts per million) or contraction, during heating or cooling. The circuit board 520, however, which may include materials such as copper may expand and contract at a different rate (e.g., 17 parts per million). Of course, because the semiconductor 100 is large the corresponding circuit board 520 is large so that a heating effect (when powered) applied to the assembly 500 may mainly causes the circuit board 520 to expand so greatly relative to the semiconductor 100 on the opposite side of the elastomeric connector 510 to cause to a large shearing force and resulting shearing effect on the connector 510.

However, as mentioned above, the configuration of the ball wires (e.g., roundness or substantial roundness) allows the balls to shift or slide against each other and thereby absorb and resist the shearing force caused due to the heating of the circuit board 520 and the semiconductor with mismatched CTEs.

3. Method for Assembling an IC with an Elastomeric Connector

As shown in FIG. 7, a method 700 for implementing an elastomeric connector in a semiconductor assembly includes providing a semiconductor substrate S710, providing a semiconductor board S720, providing an elastomeric connector S730, disposing the elastomeric connector between the semiconductor substrate and the semiconductor board S740. Optionally, providing compression to an assembly of the semiconductor substrate, the elastomeric connector, and the semiconductor board S750.

S710, which includes providing the semiconductor substrate, functions to identify and provide for assembly a semiconductor substrate, such as a silicon wafer. The semiconductor conductor substrate may preferably be formed by a large silicon die having a plurality of die formed therein. Each of the plurality of die may have been subject to a number of lithography processes to fabricate circuitry thereon. Additionally, adjacent and/or pairs of die on the semiconductor substrate may be communicatively connected via inter-die connections formed using a similar lithography process used to fabricate circuitry on each of the die. Further, the semiconductor substrate may include conductive pads that function to pass electrical signals.

Prior to assembly to the elastomeric connector and semiconductor board, the semiconductor substrate may additionally have been subject to a substrate reduction process that reduces excess die (or unused die) from the substrate and that also, shapes the semiconductor substrate into system optimal configuration (e.g., a rectangular shape).

S710 may function to provide the semiconductor substrate to be positioned a top of the assembly which includes the semiconductor substrate, the elastomeric connector, and the semiconductor board such that conductive pads located at a bottom of the semiconductor substrate are disposed on a top surface of the elastomeric connector.

S720, which includes providing the elastomeric connector, functions to provide for assembly with the semiconductor substrate and the semiconductor board an elastomeric conductor that enables electrical communication between the semiconductor substrate and the semiconductor board and that also functions to elastically resist shearing forces from permanent deformations of an assembly of the semiconductor substrate and/or semiconductor board due to environmental changes, such as an increase in the presence of heat surrounding the assembly.

The elastomeric connector preferably includes ball wires as means that function to provide signal conductivity when under compression (due to assembly load forces) and, at a same time or contemporaneously, provide an elastic effect to the assembly. The ball wires may be made of any suitable conductive material. Additionally, in an uncompressed state of the elastomeric connector, the ball wires may be distributed throughout a membrane of the elastomeric connector such that the ball wires are not in contact or sufficient contact to conduct signals. Thus, in several embodiments, compression of the assembly may be necessary to achieve the signal conductivity between the semiconductor substrate and the semiconductor board.

As discussed previously, compressive loads to the elastomeric connector may cause the ball wires to come into contact with vertically adjacent ball wires thereby forming a vertical conductive path. The vertical conductive path formed by the ball wires under sufficient compressive loads may additionally form an arc configuration while maintaining conductive contact with both the semiconductor substrate and the semiconductor board. The arc configuration of the vertical conductive paths function to provide the elastic effect that is capable of resisting or absorbing shearing forces of the assembly system.

In one variation of S720, wires may be used in lieu of ball wires to provide a conductive path as well as an elastic effect to allow for shearing forces. The wires may be made of any suitable conductive material. The wires may be distributed throughout a membrane of the elastomeric connector to extend vertically from a top surface of the membrane to a bottom surface of the membrane. Even without compression of the assembly, in some instances, the wires may be able to electrically conduct a signal between the semiconductor substrate and the circuit board.

While the wires may be suitable for conductivity in many embodiments of the present application, the ball wires may provide a more suitable elastic element for allowing shear forces to act on the assembly without permanent deformation or damage. Also, because the wires may include flat or square contact surfaces at the conductive pads of the semiconductor substrate and the semiconductor board, it may be more suitable to use ball wires which provide a more flexible or moveable (slidable) contact surface due to their round or substantially round configuration. It shall be noted that in some embodiments, it may be possible to configure the ends of the wires to include round or substantially round contact points to avoid damaging (eroding) or a substantial wear of the conductive pads. Additionally, it may be possible to select (or reinforce) a wire material that is sufficiently malleable to allow shear forces similar to ball wires.

S720 functions to dispose the elastomeric connector at a position between the opposing conductive pads of the semiconductor substrate and the semiconductor board. That is, the elastomeric conductor may preferably be sandwiched between the semiconductor substrate and the semiconductor board.

S730, which includes providing the semiconductor board, functions to provide a semiconductor board, such as a PCB or an organic substrate, for assembly with the semiconductor substrate together with the elastomeric connector. The semiconductor board may include conductive pads that preferably oppose conductive pads of the semiconductor substrate and that also act as an attachment or securing surface for the elastomeric connector. The semiconductor substrate is preferably positioned at a bottom of an assembly that includes the semiconductor substrate and the elastomeric connector.

S740, which includes disposing the elastomeric connector between the semiconductor substrate and the semiconductor board, functions to dispose the elastomeric connector at a position between the opposing conductive pads of the semiconductor substrate and the semiconductor board. That is, the elastomeric conductor may preferably be sandwiched between the semiconductor substrate and the semiconductor board.

Optionally, S750, which includes providing compression to an assembly of the semiconductor substrate, the elastomeric connector, and the semiconductor board, functions to apply a compression load sufficient to maintain the assembly together as well as allow conductive contact between the conductive material within the elastomeric connector. The compressive loads may be provided based on a clamping of the entire assembly, as described in Application Ser. No. 62/549,677, which is incorporated in its entirety by this reference.

It shall be understood that the method 700 is an exemplary method that may be implemented in any suitable order to achieve the inventions and/or embodiments of the inventions within the purview or that may be easily contemplated in view of the disclosure provided herein. For instance, S710-S730 of method 700 may be performed in any order without departing for the scope of the inventions described herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

We claim:
1. A method comprising:
providing a printed circuit board (PCB), a broad side of the PCB comprising a first surface and a first plurality of conductive pads;
providing an integrated circuit, a broad side of the integrated circuit comprising a second surface and a second plurality of conductive pads;
interposing a compliant connector between the integrated circuit and the PCB, wherein pairs of the conductive pads are arranged in one-to-one alignment, each pair comprising a first conductive pad of the first plurality and second conductive pad of the second plurality opposing the first conductive pad across a thickness of the compliant connector; and
loading of the compliant connector with a mechanical stress,
wherein the compliant connector:
based on the mechanical stress, simultaneously contacts the first and second surfaces and the first and second pluralities of conductive pads;
is configured to form electrical pathways between the pairs of conductive pads, the electrical pathways having curvatures of varying radii; and
is configured to elastically deform based on a thermal expansion mismatch between the PCB and integrated circuit wafer.

2. The method of claim 1, wherein interposing the compliant connector comprises, while the compliant connector is in an uncompressed state:
arranging the compliant connector between the PCB and the integrated circuit; and
aligning the pairs of the conductive pads of the first and second pluralities.

3. The method of claim 2, wherein loading the compliant connector with the mechanical stress comprises:
with the compliant connector initially in the uncompressed state, compressing the compliant connector between the PCB and the integrated circuit to place the compliant connector into a seated position; and
securing the integrated circuit relative to the PCB to retain the compliant connector in the seated position.

4. The method of claim 3, wherein securing the integrated circuit relative to the PCB comprises:
statically coupling the compliant connector to each of the first and second surfaces.

5. The method of claim 1, wherein loading the compliant connector with the mechanical stress comprises:
dynamically absorbing a shear stress, the shear stress arising from a thermal expansion of at least one of: the PCB and the integrated circuit.

6. The method of claim 5, wherein the varying radii of the arcuate electrical pathway shift according to the dynamic absorption of the shear stress.

7. The method of claim 1, wherein each of the electrical pathways comprises a first and second end respectively coupled to the first and second conductive pads of a corresponding pair of conductive pads, wherein the first and second ends are within the thickness of the compliant connector, wherein the first and second ends are electrically decoupled in the uncompressed state, wherein loading the compliant connector with the mechanical stress comprises electrically coupling the first and second ends to form the electrical pathway.

8. The method of claim 1, wherein the compliant connector comprises an elastomeric body and a plurality of conductive elements arranged therein.

9. The method of claim 8, wherein each of the electrical pathways comprises ball wire.

10. The method of claim 8, wherein the mechanical stress comprises a shear stress, wherein the varying radii of the arcuate electrical pathway shift based on the plurality of conductive elements sliding against each other.

11. The method of claim 1, wherein the PCB and the integrated circuit wafer have different coefficients of thermal expansion, wherein the thermal expansion mismatch is based on a difference between the different coefficients of thermal expansion of the integrated circuit wafer and the PCB.

12. The method of claim 1, wherein an area of the first surface of the integrated circuit exceeds 7,300 square millimeters.

13. A system comprising:
a compliant connector configured to be:
interposed between an integrated circuit and a printed circuit board (PCB); and
loaded with a mechanical stress,
wherein, based on the mechanical stress, the compliant connector is configured to:
contact both a first surface of the PCB and a plurality of conductive pads of the PCB;
contact both a first surface of the integrated circuit wafer and a plurality of conductive pads of the integrated circuit wafer; and
elastically deform based on a thermal expansion mismatch between the semiconductor wafer and the PCB.

14. The system of claim 13, wherein the compliant connector comprises a plurality of conductive elements distributed within a body of an elastomeric membrane.

15. The system of claim 13, wherein the PCB and the integrated circuit have different coefficients of thermal expansion, wherein the thermal expansion mismatch is based on a difference between the different coefficients of thermal expansion of the integrated circuit wafer and the PCB.

16. The system of claim 13, wherein the integrated circuit defines a broad face, wherein distinct pairs of conductive pads have one-to-one alignment along a direction normal to the broad face, each distinct pair of conductive pads comprising a conductive pad of the first plurality and a corresponding conductive pad of the second plurality.

17. The system of claim 16, wherein the compliant connector is configured to connect the PCB and the integrated circuit wafer using a plurality of electrical pathways between the distinct pairs of conducting pads, the electrical pathways having curvatures of varying radii.

18. The system of claim 13, wherein the integrated circuit comprises a singular integrally continuous form having a plurality of distinct die integrally formed within the singular integrally continuous form.

19. The system of claim 13, wherein an area of the first surface of the integrated circuit exceeds 7,300 square millimeters.

20. The system of claim 13, wherein the system further comprises the integrated circuit and the PCB.

* * * * *